(12) United States Patent
Otsubo et al.

(10) Patent No.: US 10,569,351 B2
(45) Date of Patent: Feb. 25, 2020

(54) SOLDERING DEVICE

(71) Applicant: FUJI CORPORATION, Chiryu-shi (JP)

(72) Inventors: Satoru Otsubo, Anjo (JP); Noriaki Iwaki, Hekinan (JP)

(73) Assignee: FUJI CORPORATION, Chiryu-shi (JP)

( * ) Notice: Subject to any disclaimer, the term of this patent is extended or adjusted under 35 U.S.C. 154(b) by 0 days.

(21) Appl. No.: 16/321,981

(22) PCT Filed: Aug. 1, 2016

(86) PCT No.: PCT/JP2016/072554
§ 371 (c)(1),
(2) Date: Jan. 30, 2019

(87) PCT Pub. No.: WO2018/025314
PCT Pub. Date: Feb. 8, 2018

(65) Prior Publication Data
US 2019/0176256 A1    Jun. 13, 2019

(51) Int. Cl.
| | | |
|---|---|---|
| B23K 1/00 | (2006.01) |
| B23K 1/08 | (2006.01) |
| H05K 3/34 | (2006.01) |
| B23K 3/06 | (2006.01) |
| B23K 20/00 | (2006.01) |
| B23K 101/42 | (2006.01) |
| B23K 101/40 | (2006.01) |

(52) U.S. Cl.
CPC .............. *B23K 1/08* (2013.01); *B23K 1/0016* (2013.01); *B23K 1/085* (2013.01); *B23K 3/0653* (2013.01); *B23K 20/00* (2013.01); *H05K 3/34* (2013.01); *B23K 2101/40* (2018.08); *B23K 2101/42* (2018.08)

(58) Field of Classification Search
CPC ...... B23K 1/0016; B23K 1/008; B23K 1/203; B23K 2101/42; B23K 3/0638; H05K 13/0465
See application file for complete search history.

(56) References Cited

U.S. PATENT DOCUMENTS

| 4,890,781 A | 1/1990 | Johnson et al. |
| 6,367,677 B1 | 4/2002 | Hildenbrand et al. |

FOREIGN PATENT DOCUMENTS

| JP | 10-209622 A | 8/1998 |
| JP | 2005-167142 A | 6/2005 |
| JP | 2006-156767 A | 6/2006 |

(Continued)

OTHER PUBLICATIONS

International Search Report dated Oct. 11, 2016 in PCT/JP2016/072554 filed Aug. 1, 2016.

*Primary Examiner* — Erin B Saad
(74) *Attorney, Agent, or Firm* — Oblon, McClelland, Maier & Neustadt, L.L.P.

(57) ABSTRACT

A control device of soldering device identifies the type of lead component to be soldered when soldering multiple types of lead components sequentially with jet device and reads out a value of a soldering parameter corresponding to the lead component type from an HDD. Then, the control device controls jet device so that the lead component is soldered based on the value of the soldering parameter. As a result, the lead of the lead component is soldered with the value of the soldering parameter corresponding to the type of the lead component.

5 Claims, 12 Drawing Sheets

(56) References Cited

FOREIGN PATENT DOCUMENTS

| | | |
|---|---|---|
| JP | 2008-109034 A | 5/2008 |
| JP | 2011-228635 A | 11/2011 |
| JP | 2011-254034 A | 12/2011 |
| JP | 2014-130948 A | 7/2014 |

FIG.12

| | | TYPES OF LEAD COMPONENTS | | | |
|---|---|---|---|---|---|
| | | FIRST | SECOND | THIRD | FOURTH |
| SOLDERING PARAMETERS | FLUX HEATING TIME | ... | ... | ... | ... |
| | SOLDER APPLICATION TIME | ... | ... | ... | ... |
| | SOLDER CURING WAITING TIME | / | / | ... | / |
| | SOLDER WITHDRAWAL SPEED | ... | ... | ... | ... |
| | TRACING SOLDERING SPEED | / | / | / | ... |
| | HEIGHT OF JET DEVICE | ... | ... | ... | ... |
| | JETTING HEIGHT OF SOLDER | ... | ... | ... | ... |

SOLDERING DEVICE

TECHNICAL FIELD

The present application relates to a soldering device

BACKGROUND ART

In a case of mounting a lead component on a circuit board, leads are inserted into through holes formed in the circuit board, and the leads are soldered. Patent Literature 1 describes a soldering device for soldering leads that are inserted in through holes by jetting molten solder towards the leads.

PATENT LITERATURE

Patent Literature 1: JP-A-10-209622

BRIEF SUMMARY

Technical Problem

Incidentally, lead components have their own appropriate parameter values that differ from lead component to lead component, and as this point has never been taken into consideration heretofore, different types of lead components have been soldered using the same parameter value. For this reason, there has been an increase in the probability of soldering defects occurring on certain types of lead components.

The present disclosure has been made to solve the technical problem described above, and a main object of the present disclosure is to appropriately solder leads of each lead component of a circuit board on which a number of lead components are mounted.

Solution to Problem

According to the present disclosure, there is provided a soldering device comprising: a soldering means for soldering leads of multiple lead component types mounted on a board by jetting molten solder reserved in a solder bath; a memory means for storing correspondences between the lead component types and a value of a soldering parameter; and a control means configured to identify the lead component type to be soldered when sequentially soldering the multiple types of lead components by the soldering means, read out a value of the soldering parameter corresponding to the lead component type identified from the correspondences stored in the memory means, and control the soldering means so that the lead of the lead component is soldered based on the value of the soldering parameter read out.

In sequentially soldering the multiple types of lead components using the soldering means, this soldering device identifies the type of lead component to be soldered and reads out the value of the soldering parameter that corresponds to the lead component type from the memory means. Then, the soldering device controls the soldering means so that the lead component is soldered based on the value of the soldering parameter. As a result, the lead of the lead component is soldered with the value of the soldering parameter corresponding to the type of the lead component. Therefore, according to the soldering device of the present disclosure, leads of each lead component of a circuit board on which a number of lead components are mounted can be soldered as required.

In the soldering device of the present disclosure, the soldering parameter may include at least one of: a flux heating time during which flux adhering to the board is heated before the molten solder is applied to the lead of the lead component; a solder application time during which the molten solder is applied to the lead of the lead component; a solder withdrawal speed at which the soldering means is moved downwards below the lead component after the soldering means ends its soldering operation; a solder curing waiting time during which solder is allowed to cure while the lead component is supported to be raised away from the board; a tracing soldering speed at which the soldering means is moved in the direction in which leads are aligned in a case where the lead component includes a number of leads; a height of the soldering means relative to the lead of the lead component, and a jetting height of the molten solder. Since the soldering parameters listed here often differ from one lead component type to another, applying the soldering device of the present disclosure is highly meaningful.

In the soldering device of the present disclosure, the soldering parameter may include the flux heating time, the soldering means may have a gas injecting section configured to inject a nitrogen gas heated by making use of a heat of the molten solder, and the control means may control the gas injecting section so that the nitrogen gas injected from the gas injecting section heats the flux by the flux heating time included in the value of the soldering parameter read out. Flux is preferably heated to an activation temperature at a point in time immediately before soldering is performed. In general, flux is preheated before it is conveyed into a component mounter; however, the flux is deprived of heat due to a lead component mounted inside the component mounter, thereby reducing the temperature of the flux and causing the flux to deactivate. The larger the lead component, the more heat the flux tends to be deprived of. Therefore, it is preferable to appropriately reheat and activate the flux of the lead component by setting a flux heating time corresponding to the lead component type. Here, the nitrogen gas heated by the heat of the molten solder is applied to the flux or the periphery thereof to heat and activate the flux. Therefore, not only can the oxidation of the flux be prevented by the nitrogen gas, but also the heat of the molten solder can be effectively used to heat the flux.

The soldering device of the present disclosure may include a moving means for moving the soldering means, wherein the soldering parameter includes the solder withdrawal speed, and the control means controls the moving means so that the soldering means is moved downwards below the lead component at the solder withdrawal speed included in the value of the soldering parameter read out. By adopting this configuration, since the solder withdrawal speed is set according to the type of the lead component, for example, the soldering means is allowed to move away from below the lead component at low speeds, move away at high speeds, or move away at low speeds initially and then to move away at high speeds.

In the soldering device of the present disclosure, the soldering parameter may include the solder curing waiting time, the soldering means may include a component support section configured to support the lead component to be raised away from the board, and the control means may control the component support section so that the component support section supports the lead component with being raised away from the board for the duration of the solder curing waiting time included in the value of the soldering parameter read out. By adopting this configuration, the lead component can be reliably kept raised away from the board and supported by making use of the component support section for the duration of the solder curing waiting time. In relation to a lead component that does not have to be raised away from the board, the component mounting process preferably proceeds to the next step without setting the solder curing waiting time, thereby improving the productivity.

The soldering device of the present disclosure may be integrated with a component mounting device configured to hold the lead component supplied from a component supply device and move the lead component to a predetermined position on the board so that the lead of the lead component is inserted into a through hole provided in the predetermined position. By adopting this configuration, compared with a case where the component mounting device and the soldering device are provided separately, components can be processed in the common area shared between the component mounting device and the soldering device, thereby making it possible to reduce cost but also to reduce size. Further, since circuit boards do not have to be conveyed in and out of the component mounting device and the soldering device separately, working time can be reduced.

BRIEF DESCRIPTION OF DRAWINGS

FIG. 12 is a table showing the correspondences between lead component types and soldering parameters.

DESCRIPTION OF EMBODIMENT

Figure 1:
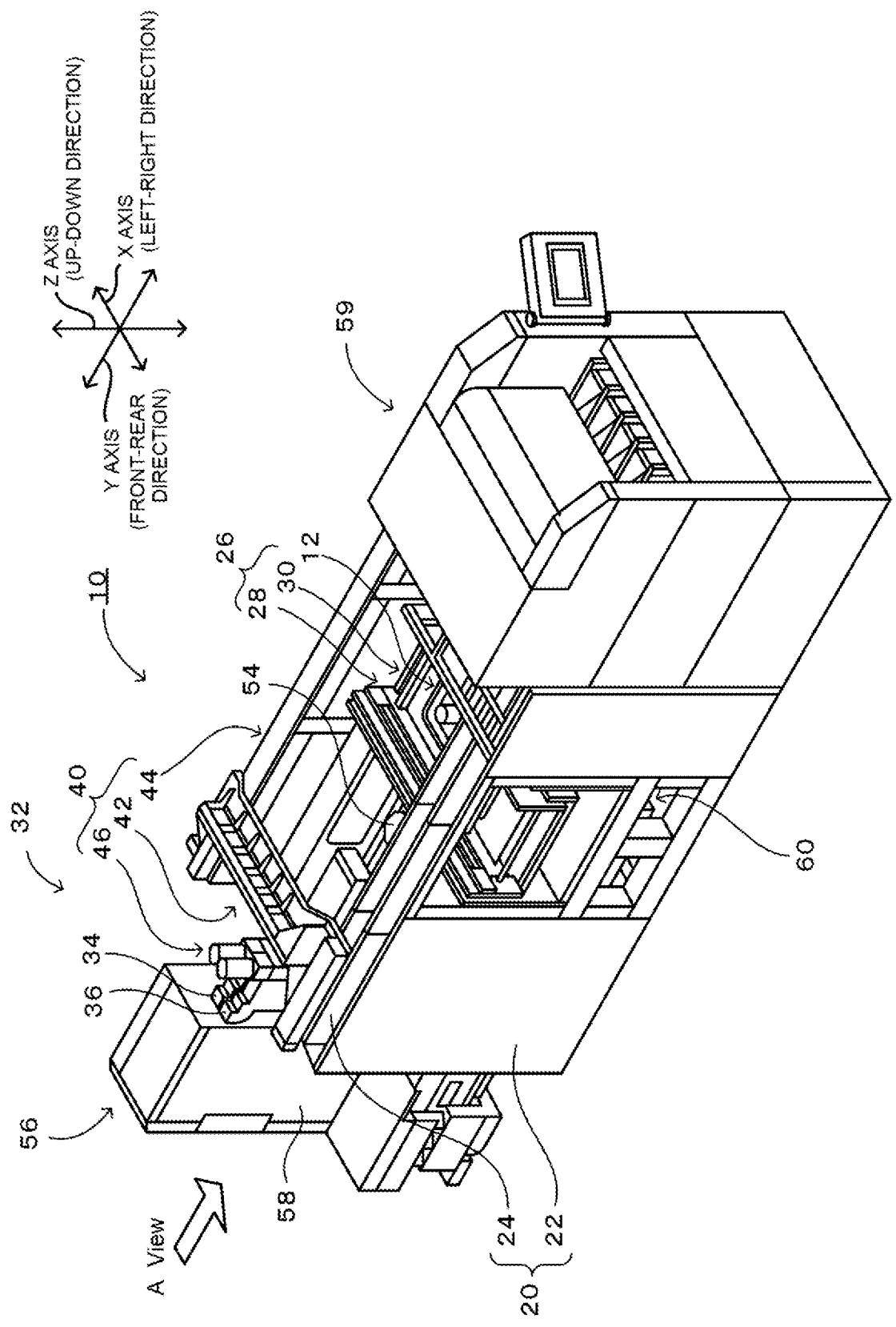
FIG. 1 is a perspective view showing a schematic configuration of component mounter 10.
Figure 2:
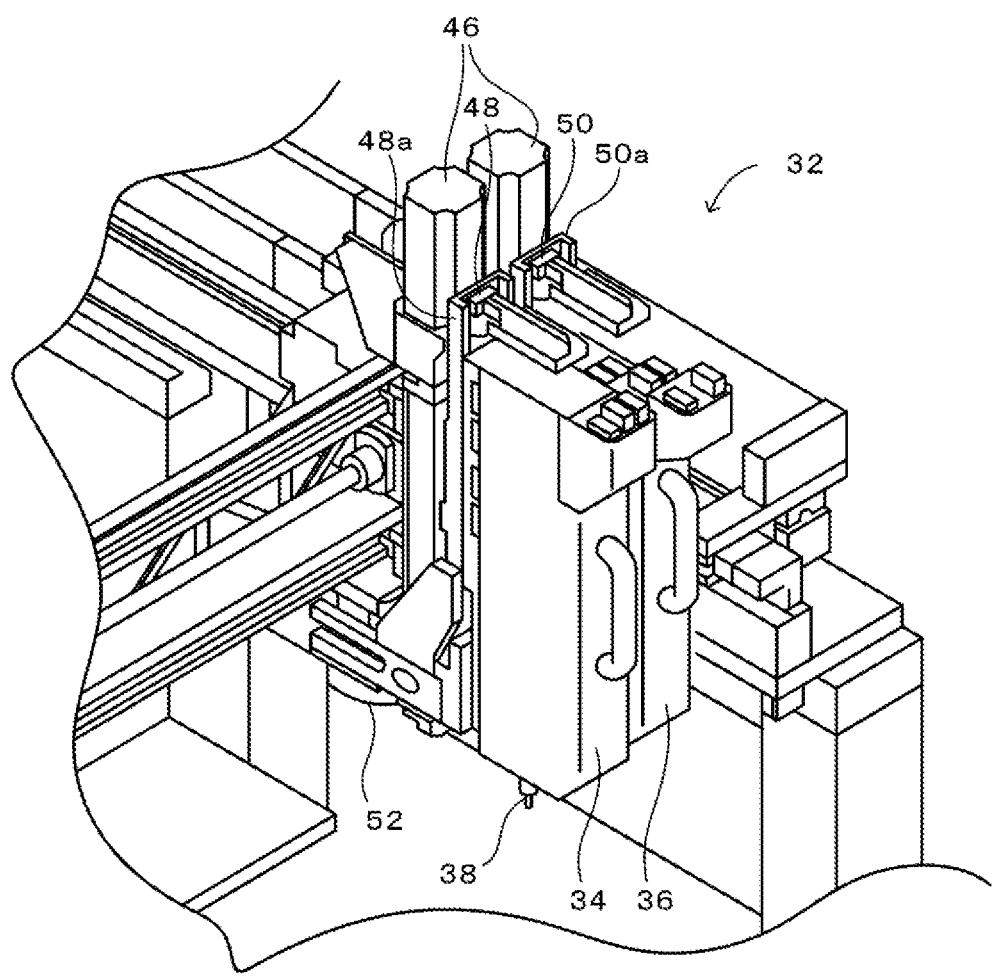
FIG. 2 is a perspective view of component mounting device 32.
Figure 3:
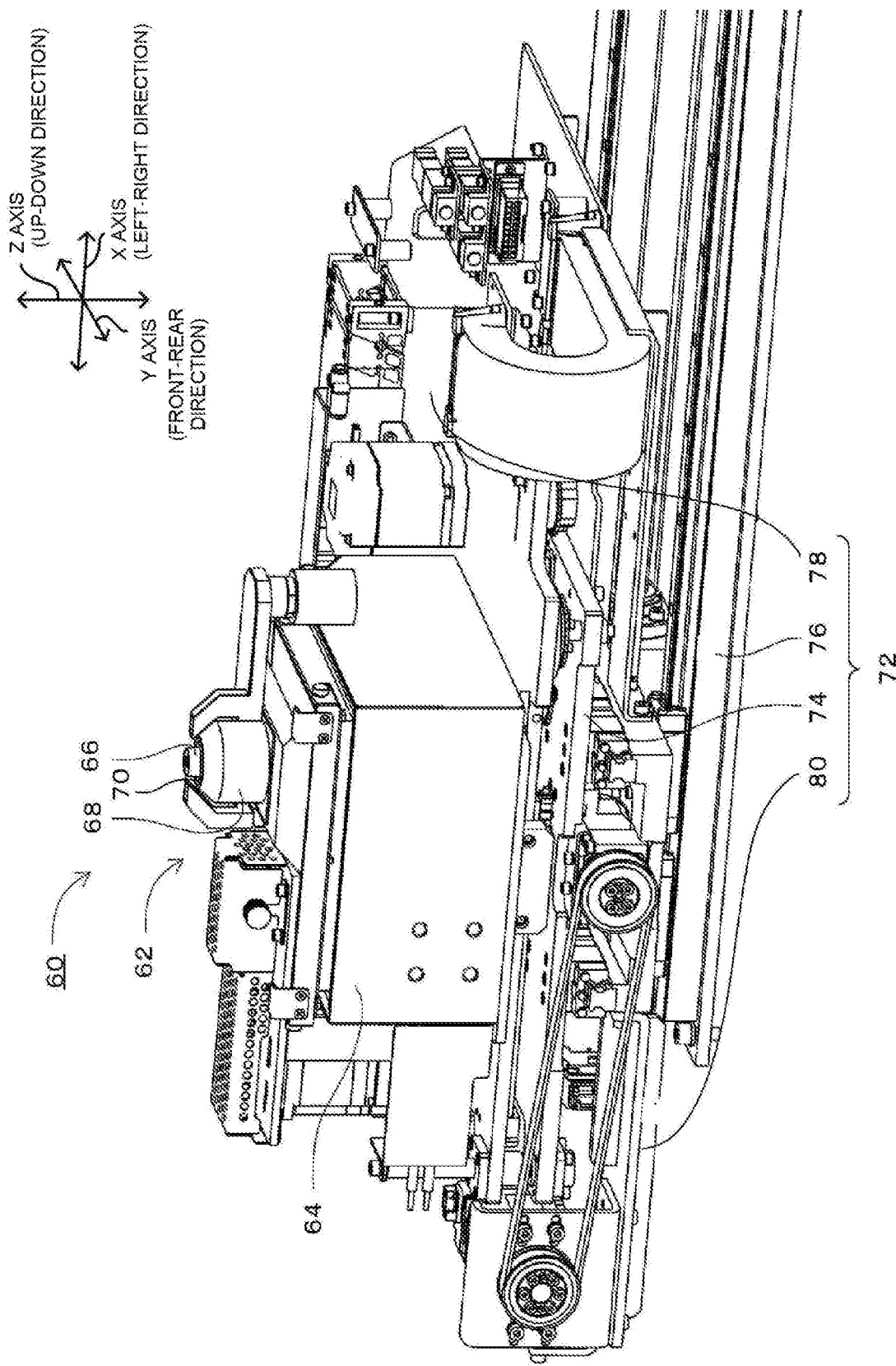
FIG. 3 is a perspective view of soldering device 60.
Figure 4:
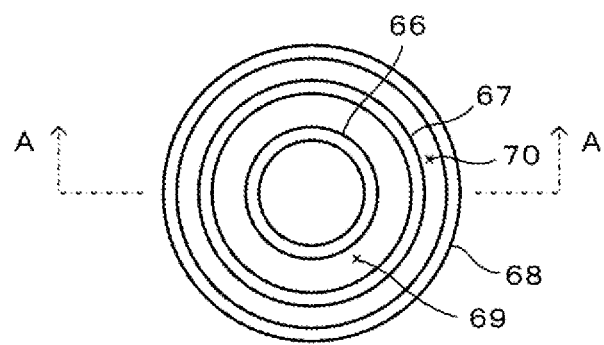
FIG. 4 is a plan view of a periphery of jet nozzle 66.
Figure 5:
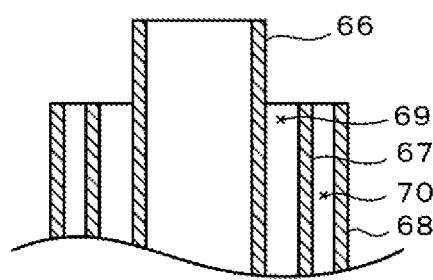
FIG. 5 is a sectional view taken along line A-A in FIG. 4.
Figure 6:
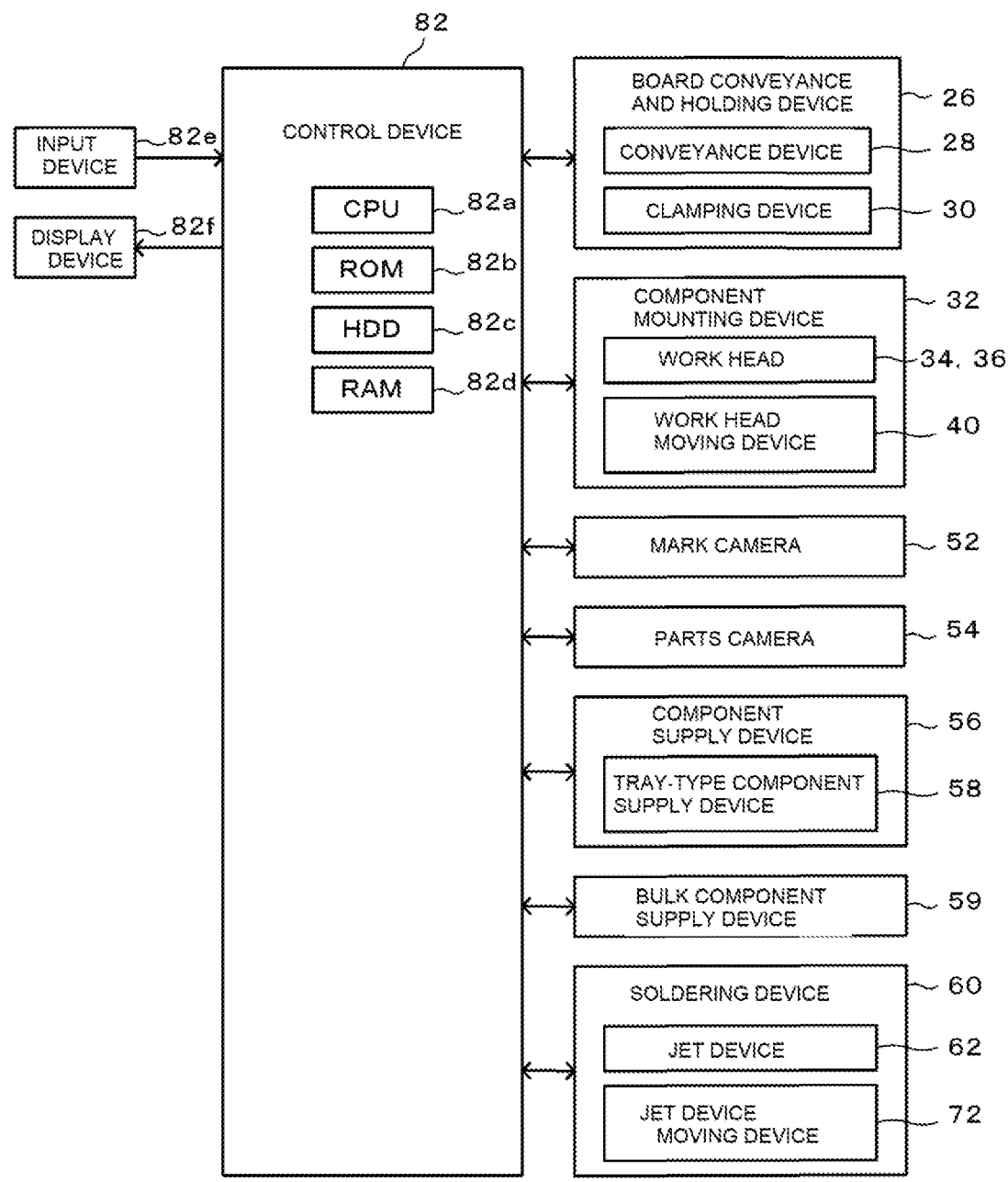
FIG. 6 is a block diagram showing electrical connections of control device 82.

Referring to drawings, a preferred embodiment of the present disclosure will be described below. FIG. 1 is a perspective view showing a schematic configuration of component mounter 10, FIG. 2 is a perspective view (a view shown from a direction indicated by an arrow A in FIG. 1) of component mounting device 32, FIG. 3 is a perspective view of soldering device 60, FIG. 4 is a plan view of a periphery of jet nozzle 66, FIG. 5 is a sectional view taken along a line A-A in FIG. 4, and FIG. 6 is a block diagram showing electrical connections of control device 82.

FIG. 1 shows component mounter 10. Component mounter 10 performs mounting work of mounting an electronic component on circuit board 12 and soldering work of soldering the electronic component mounted on circuit board 12. Component mounter 10 includes mounting machine main body 20, board conveyance and holding device 26, component mounting device 32, mark camera 52, parts camera 54, component supply device 56, bulk component supply device 59, soldering device 60 (refer to FIG. 3), and control device 82 (refer to FIG. 6). In this embodiment, the left-right direction (X axis), the front-rear direction (Y axis), and the up-down direction (Z axis) are as shown in FIGS. 1 and 3.

Mounting machine main body 20 is made up of frame section 22, and beam section 24 provided to extend over frame section 22.

Board conveyance and holding device 26 is provided at a center of frame section 22 in the front-rear direction and has conveyance device 28 and clamping device 30. Conveyance device 28 conveys circuit board 12 in the left-right direction using a conveyor belt and a shuttle arm, which are not shown. On circuit board 12 that is conveyed into component mounter 10, flux is already applied to locations to be soldered, and the flux is already preheated. Clamping device 30 lifts up circuit board 12 from the conveyor belt and holds circuit board 12 while pressing it against a guide, not shown, or lowers circuit board 12 back onto the conveyor belt and releases circuit board 12 from being held. That is, in addition to conveying circuit board 12 in the left-right direction, board conveyance and holding device 26 also fixes and holds circuit board 12 in a predetermined position.

Component mounting device 32 is disposed in beam section 24 and includes two work heads 34, 36 and work head moving device 40. As shown in FIG. 2, suction nozzle 38 is provided on the lower end face of work heads 34, 36. Suction nozzle 38 picks up and holds an electronic component by negative pressure supplied from a vacuum pump, not shown, and releases the electronic component that it holds when atmospheric pressure or positive pressure is supplied thereto. Work head moving device 40 includes X-axis moving device 42, Y-axis moving device 44, and Z-axis moving device 46. Two work heads 34, 36 are moved together to an arbitrary position on the XY plane of frame section 22 by X-axis moving device 42 and Y-axis moving device 44. As shown in FIG. 2, work heads 34, 36 are detachably mounted on sliders 48, 50, respectively, and Z-axis moving device 46 moves sliders 48, 50 in an up-down direction along slider rails 48a, 50a, respectively. This enables work heads 34, 36 to be moved individually in the up-down direction by Z-axis moving device 46. Mark camera 52 is mounted on slider 48 while being directed to face downwards as shown in FIG. 2 and is moved together with work head 34 in the front-rear direction, laterally, and vertically. Mark camera 52 is used to capture an image of a board mark (not shown) provided on circuit board 12 for use in positioning circuit board 12.

As shown in FIG. 1, parts camera 54 is installed above frame section 22 between board conveyance and holding device 26 and component supply device 56 while being directed to face upwards. Parts camera 54 captures images of electronic components picked up and held by suction by suction nozzles 38 of work heads 34, 36 from below when the electronic component passes over parts camera 54.

Component supply device 56 is disposed at both ends of frame section 22 in the front-rear direction. In FIG. 1, tray-type component supply device 58 is disposed at a first end side and bulk component supply device 59 is disposed at a second end side of frame portion 22. Tray-type component supply device 58 supplies electronic components that are placed on a tray. Bulk component supply device 59 aligns multiple electronic components scattered in a bulky fashion and supplies electronic components that are aligned.

In place of or in addition to tray-type component supply device 58 and bulk component supply device 59, a feeder-type component supply device may be provided. In the feeder-type component supply device, electronic components are supplied by a tape feeder or a stick feeder.

Soldering device 60 is provided below conveyance device 28 and includes jet device 62 and jet device moving device 72, as shown in FIG. 3.

Jet device 62 includes solder bath 64, jet nozzle 66, nozzle cover 68, and gas injection section 70. Solder bath 64 has a substantially rectangular parallelepiped shape and reserves molten solder in the interior thereof. Jet nozzle 66 is provided on the upper surface of solder bath 64. Molten solder is pumped up from solder bath 64 by a pump (not shown) and is jetted upwards from an upper end opening of jet nozzle 66. As shown in FIGS. 4 and 5, cylindrical nozzle cover 68 is lower in height than jet nozzle 66 and is provided on the upper surface of solder bath 64 so as to surround jet nozzle cover 66. Partition pipe 67 is disposed concentrically with jet nozzle 66 between jet nozzle 66 and nozzle cover 68. Gas injection section 70 constitutes a section defined by an outer peripheral surface of partition pipe 67, which is lower in height than jet nozzle 66, and an inner peripheral surface of nozzle cover 68 and has an annular upper end opening. Gas injection section 70 is connected to a nitrogen gas cylinder, not shown. Nitrogen gas from the nitrogen gas cylinder is heated by molten solder and is then injected upwards from the annular upper end opening of gas injection section 70. Molten solder jetted from jet nozzle 66 passes through return passage 69 defined between the outer peripheral surface of jet nozzle 66 and the inner peripheral surface of partition pipe 67 to return to the interior of solder bath 64.

As shown in FIG. 3, jet device moving device 72 includes slider 74, X-axis moving device 76, Y-axis moving device 78, and Z-axis moving device 80. Slider 74 has a generally horizontal plate shape, and jet device 62 is disposed on the upper surface of slider 74. X-axis moving device 76 moves slider 74 in a conveyance direction of circuit board 12 by conveyance device 28, that is, in the left-right direction. Y-axis moving device 78 moves slider 74 in the front-rear direction. Further, Z-axis moving device 80 moves slider 74 in the up-down direction. By using these moving devices, jet device 62 is moved to any position below conveyance device 28 (refer to FIG. 1) by the action of jet device moving device 72.

As shown in FIG. 6, control device 82 is configured as a microprocessor mainly made up of CPU 82a and includes ROM 82b configured to store a process program, HDD 82c configured to store various types of data, RAM 82d configured to be used as a working region, and the like. Control device 82 is connected to input device 82e such as a mouse and a keyboard and display device 82f such as a liquid crystal display. Control device 82 is connected to board conveyance and holding device 26, component mounting device 32, mark camera 52, parts camera 54, component supply device 56, bulk component supply device 59, and soldering device 60 so that signals can be transmitted and received therebetween.

Figure 7:
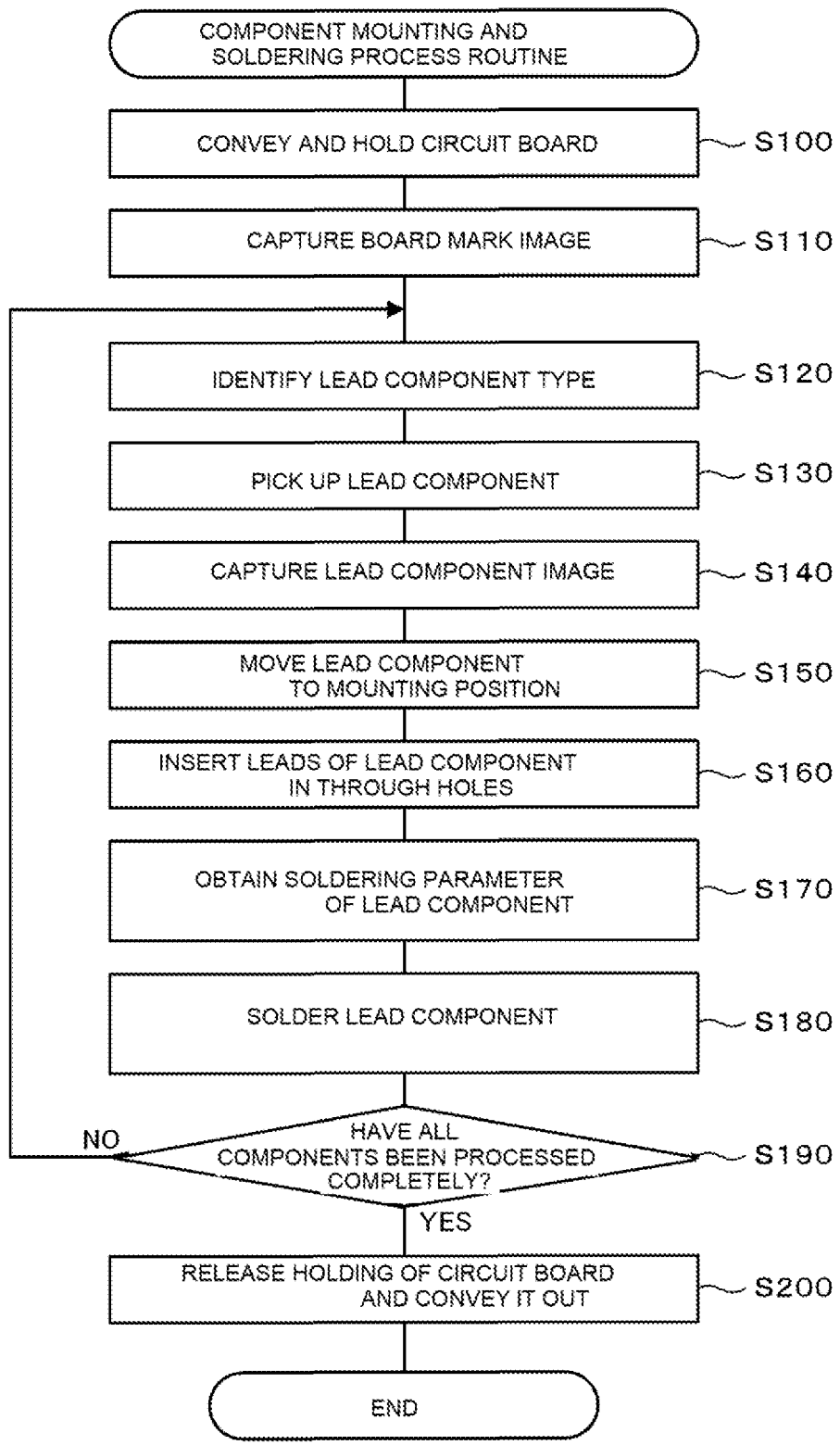
FIG. 7 is a flow chart of a component mounting and soldering process routine.

Component mounter 10 mounts an electronic component on circuit board 12 and solders the electronic component to circuit board 12 based on a production job received from a management device, not shown, and these operations of component mounter 10 will be described below with reference to FIG. 7. FIG. 7 is a flow chart of a component mounting and soldering process. Although component mounter 10 can mount various types of electronic components on circuit board 12, here, a case will be described in which component mounter 10 mounts a lead component on circuit board 12 as an electronic component. The production job defines types of electronic components that are mounted on circuit board 12, as well as the order in which such electronic components are mounted on circuit board 12 in component mounter 10.

CPU 82a of control device 82 reads out a program of a component mounting and soldering process routine from ROM 82b when a command to start the production job is inputted. Firstly, CPU 82a controls board conveyance and holding device 26 so that circuit board 12 is conveyed to a working position in component mounter 10 and is fixedly held by clamping device 30 in the working position (Step S100). Next, CPU 82a controls component mounting device 32 and mark camera 52 so that mark camera 52 is moved to a location above circuit board 12 to capture an image of a board mark, not shown, of circuit board 12 (Step S110). As a result, CPU 82a obtains positional information on circuit board 12 from a captured image of the board mark on circuit board 12.

Figure 8:
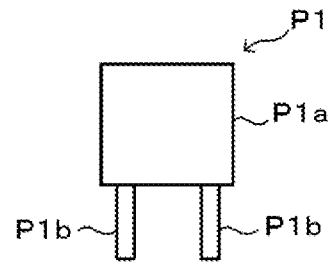
FIG. 8 is a front view of first lead component P1.
Figure 9:
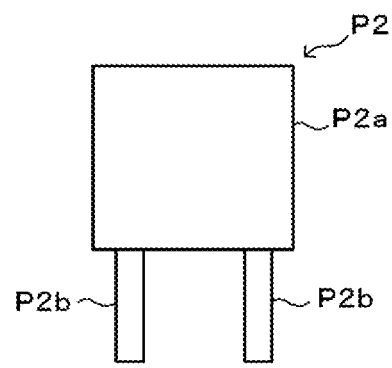
FIG. 9 is a front view of second lead component P2.
Figure 10:
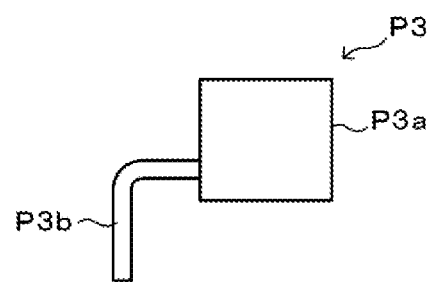
FIG. 10 is a front view of third lead component P3.
Figure 11:
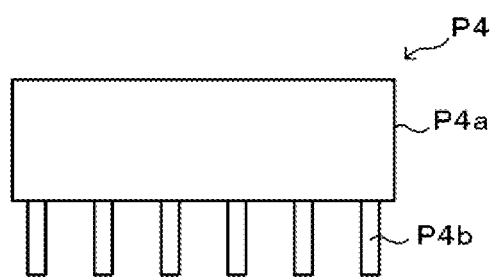
FIG. 11 is a front view of fourth lead component P4.

Next, CPU 82a obtains information on a processing target lead component (Step S120). The information on the processing target lead component includes the type of the processing target lead component. Such information can be obtained from the production job. In this embodiment, four types of lead components are to be mounted, and the four types of lead components are first to fourth lead components P1 to P4, as a matter of convenience. FIGS. 8 to 11 show front views of lead components P1 to P4. First lead component P1 is such that two rectilinear leads P1b are attached to the lower surface of a rectangular parallelepiped component main body P1a, as shown in FIG. 8. Second lead component P2 is a component larger in size than first lead component P1 and has two rectilinear leads P2b attached to the lower surface of component main body P2a, as shown in FIG. 9. Third lead component P3 is such that two (only one is shown in FIG. 10) L-shaped leads P3b are attached to a lateral surface of rectangular parallelepiped component main body P3a, as shown in FIG. 10. Fourth lead component P4 is such that a number of (here, six) rectilinear leads P4b are aligned in a row on the lower surface of horizontally elongated rectangular parallelepiped component main body P4a, as shown in FIG. 11.

Next, CPU 82a controls component supply device 56 and bulk component supply device 59 so that a lead component is supplied to a predetermined supply position and then controls component mounting device 32 so that either of work heads 34, 36 is moved to a location above the predetermined supply position so as to pick up the lead component using suction nozzle 38 (Step S130). Following this, CPU 82a controls component mounting device 32 and parts camera 54 so that work heads 34, 36 holding the lead component are moved to a location above component camera 54 so that parts camera 54 captures an image of the lead component held by suction nozzle 38 (Step S140). As a result, CPU 82a obtains information on the orientation of the lead component or the like. Following this, CPU 82a controls component mounting device 32 so that work heads 34, 36 holding the lead component are moved to a location above the predetermined position on circuit board 12 (Step S150). As this occurs, CPU 82a corrects the position of work heads 34, 36 based on the information on the orientation of the lead component or the like. Following this, CPU 82a controls component mounting device 32 so that leads of the lead component picked up and held by suction nozzle 38 are inserted into through holes formed in a predetermined mounting position on circuit board 12 (Step S160). As a result, the lead component is mounted on circuit board 12.

Next, CPU 82a obtains a soldering parameter for the lead component mounted on circuit board 12 this time based on the information (including the type of the lead component) obtained in Step S120 (Step S170). The soldering parameter includes (1) a flux heating time, (2) a solder application time, (3) a solder withdrawal speed, (4) a solder curing waiting time, (5) a tracing soldering speed, (6) a height of the soldering device, and (7) a jetting height of molten solder. The set values for each parameter are set in accordance with the lead component type. Correspondences between the lead component types and set values for the parameters are stored in HDD 82c in the form of a table. An example of this table is shown in FIG. 12. Each parameter will be described below.

(1) Flux Heating Time

Figure 13:
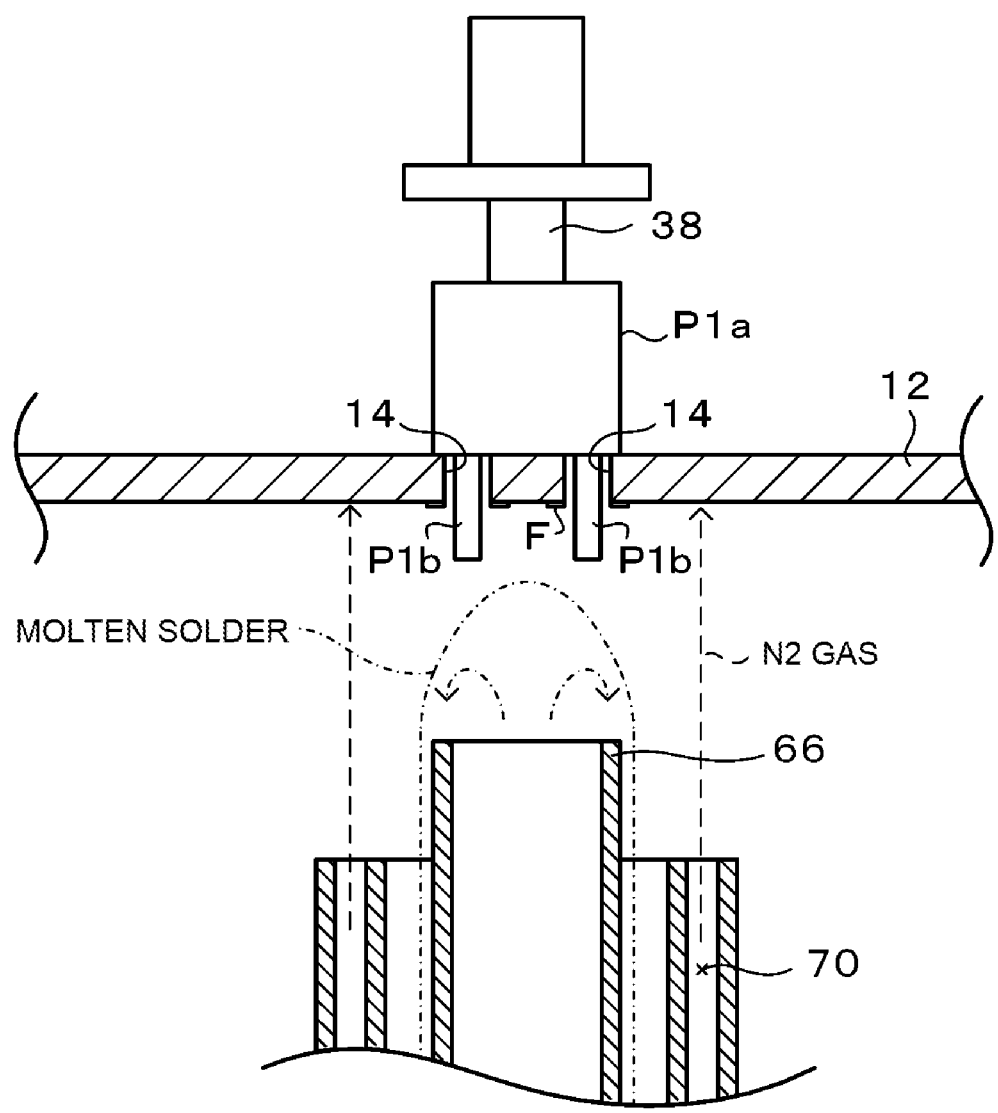
FIG. 13 is a diagram of an example of heating flux F for first lead component P1.

Flux heating time constitutes a time during which flux on circuit board 12 is heated before soldering leads of a lead component. FIG. 13 shows an example of heating flux F on first lead component P1. Lead component P1 is held by suction nozzle 38 with leads P1b inserted into through holes 14. Molten solder jetted from jet nozzle 66 does not reach the rear surface of circuit board 12. Through holes 14 into which leads P1b of first lead component P1 are inserted are provided in circuit board 12, and flux F is applied to peripheries of through holes 14. This flux F is preferably heated to an activation temperature immediately before soldering is performed. In this embodiment, nitrogen gas is injected at all times from ring-shaped gas injection section 70 to prevent oxidation of jetted solder. Control device 82 heats and activates flux F by making use of the nitrogen gas. Specifically, control device 82 controls the position of gas injection section 70 (for example, the position in the Z-axis direction) so that nitrogen gas injected from gas injection section 70 is injected against flux F applied to peripheries of through holes 14. The position of gas injection section 70 is controlled by operating jet device moving device 72. Although flux F is preheated before circuit board 12 is conveyed into component mounter 10, flux F is deprived of heat by first lead component P1 mounted in component mounter 10, thereby reducing the temperature of flux F and causing flux F to deactivate. Since the heat capacity of a lead component increases as the size of the lead component increases, the temperature of flux F tends to be reduced to a low temperature. For this reason, the flux heating time is set to increase the flux heating time to handle an increase in size of a lead component. For example, since second lead component P2 is larger in size than first lead component P1, the flux heating time is set to be longer for second lead component P2 than for first lead component P1.

(2) Solder Application Time

Figure 14:
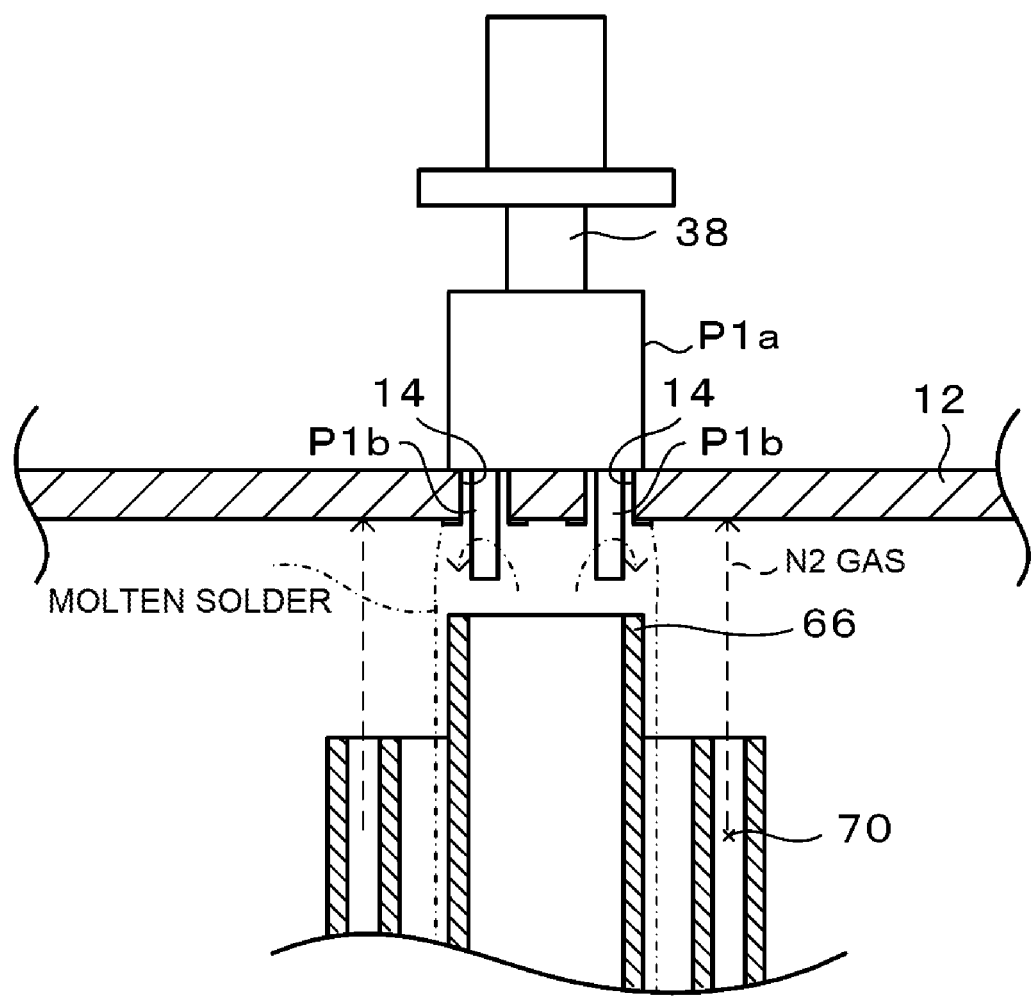
FIG. 14 is a diagram of an example of soldering leads P1b of first lead component P1.

Solder application time constitutes a time during which molten solder is applied to the leads of the lead component which are inserted into the through holes of circuit board 12 and the peripheries of the through holes. FIG. 14 shows an example of soldering the leads P1b of first lead component P1. Lead component P1 is held by suction nozzle 38 with leads P1b inserted into through holes 14. Molten solder jetted from jet nozzle 66 sufficiently reaches leads P1b and the peripheries of through holes 14. Nitrogen gas is injected continuously from gas injection section 70 to prevent oxidation of solder or the like. To form a good fillet, molten solder is preferably applied steadily to a lead component while being kept warm. The thermal capacity of a lead component increases as the size thereof increases, and hence, a large lead component tends to be difficult to warm. Therefore, a solder application time is set so that the solder application time is long enough to be handle an increase in size of a lead component. For example, since second lead component P2 is larger in size than first lead component P1, the soldering time is set to be longer for second lead component P2 than for first lead component P1.

(3) Solder Withdrawal Speed

Solder withdrawal speed constitutes a speed at which jet device 62 is moved downwards below the lead component after soldering is completed. For example, the solder withdrawal speed constitutes a speed at which jet device 62 is moved from a state where molten solder is applied to leads P1b and the peripheries of through holes 14 as shown in FIG. 14 to a state where molten solder does not reach leads P1b as shown in FIG. 13. Depending on types of lead components, jet device 62 is set to be moved away from below a lead component at low speeds, to be moved away from below a lead component at high speeds, or to be moved away from below a lead component at low speeds initially and at high speeds thereafter.

(4) Solder Curing Waiting Time

Figure 15:
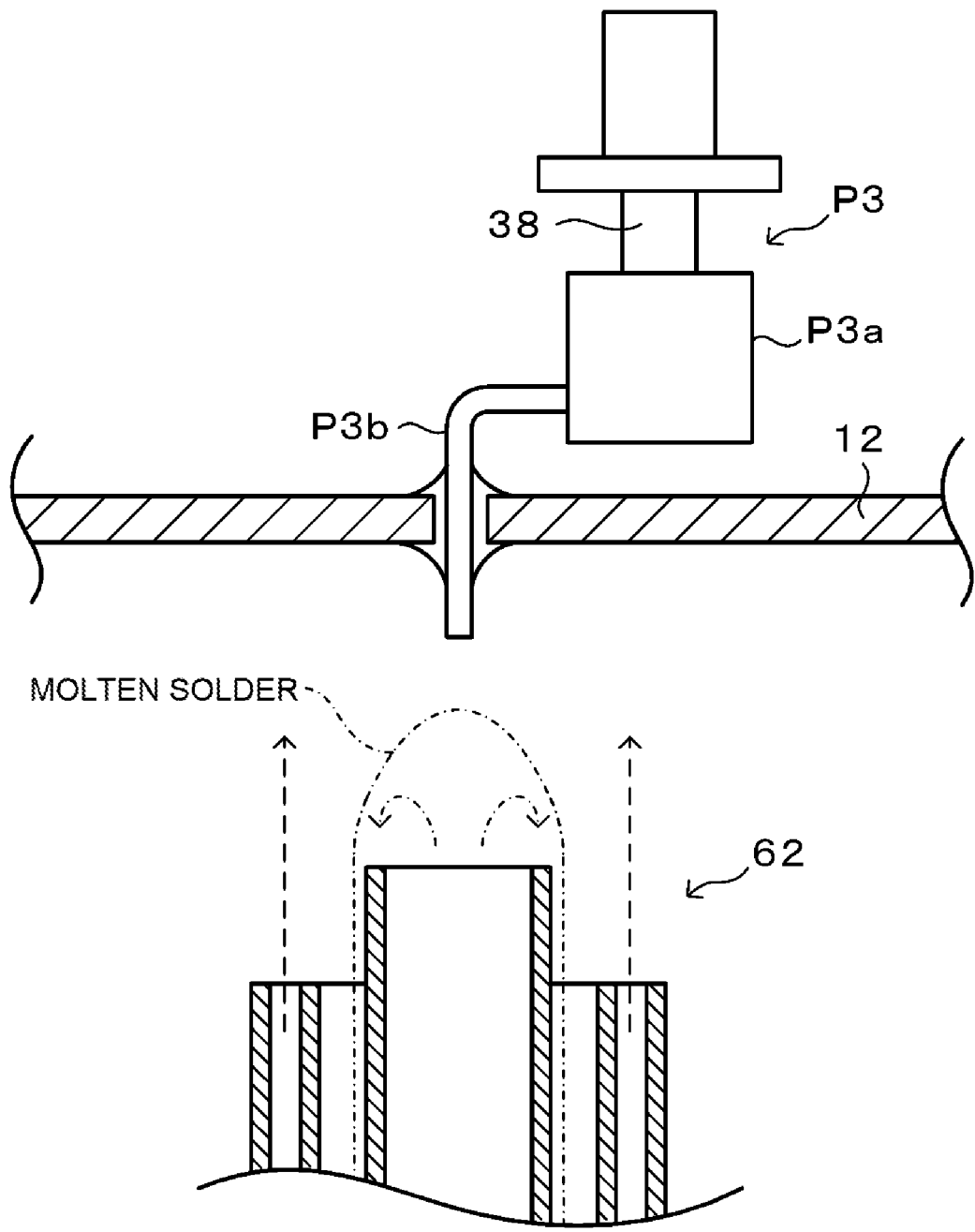
FIG. 15 is a diagram of an example of soldering leads P3b of third lead component P3.

Solder curing waiting time constitutes a waiting time for solder to cure with the lead component while being kept raised from circuit board 12 and supported after soldering is completed. FIG. 15 shows an example of soldering L-shaped leads P3b of third lead component P3. Here, jet device 62 is withdrawn low enough so that molten solder does not reach leads P3b. Suction nozzle 38 supports third lead component P3 while being kept raised away from circuit board 12 so that molten solder does not reach leads P3b until molten solder hardens. Since first, second, and fourth lead components P1, P2, P4, do not have to be raised from circuit board 12, the solder curing waiting time is not set therefor.

(5) Tracing Soldering Speed

Figure 16:
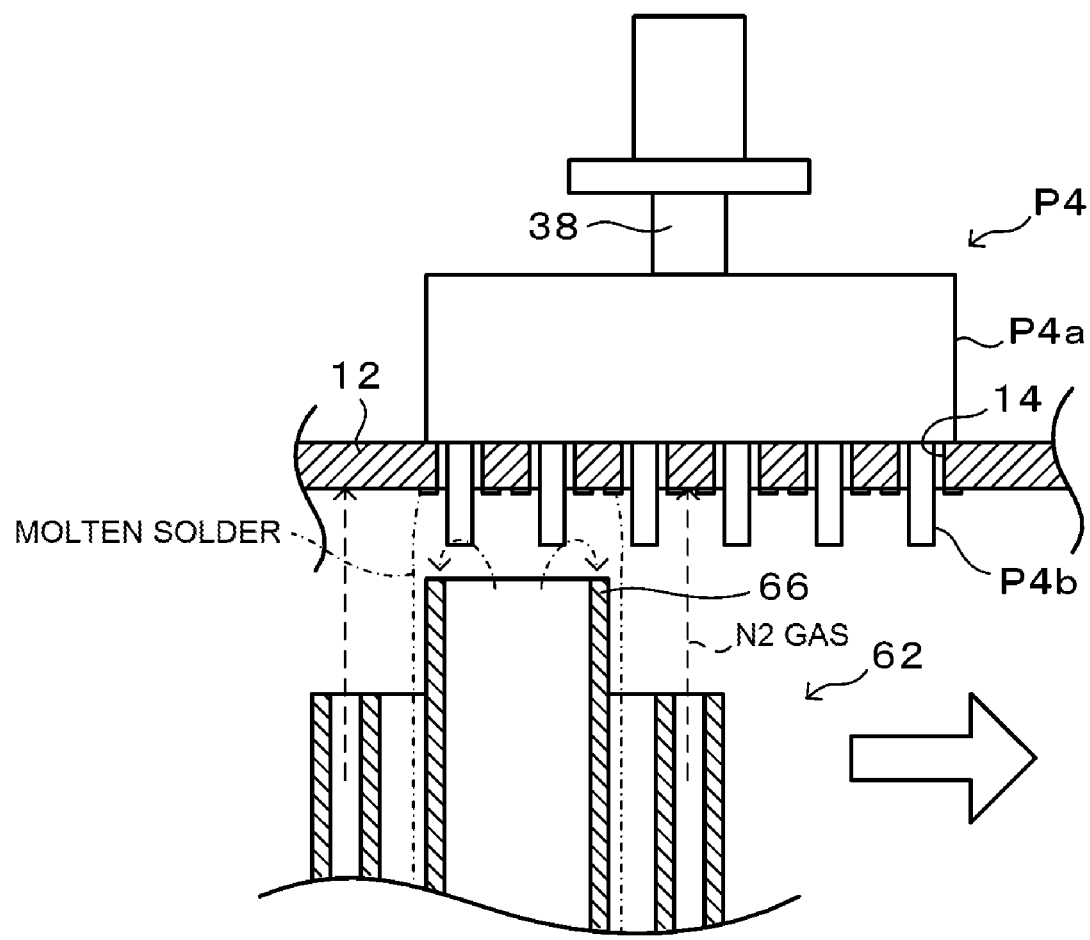
FIG. 16 is a diagram of an example of soldering leads P4 of fourth lead component P4.

The tracing soldering speed constitutes a speed at which jet device 62 of soldering device 60 is moved in a direction in which leads are aligned when a lead component includes a number of leads. FIG. 16 shows an example of soldering a number of (here, six) leads P4b of fourth lead component P4. In FIG. 16, fourth lead component P4 is held by suction nozzle 38 with six leads P4b inserted in six through holes 14 in circuit board 12. In this state, jet device 62 moves from end to end of a row where multiple leads P4b are aligned and solders leads P4b sequentially. Since first to third lead components P1 to P3 do not have to be soldered sequentially by moving jet device 62, the tracing soldering speed do not have to be set for those lead components.

(6) Height of Soldering Device

The height of a soldering device is the height of jet device 62 of soldering device 60 relative to the leads of the lead component. The height of jet device 62 is set so that the leads of the lead components do not interfere with jet nozzle 66. However, when leads of a lead component are long, the height of jet device 62 is set so that the leads enter inside of jet nozzle 66.

(7) Jetting Height of Molten Solder

The jetting height of molten solder constitutes a height of molten solder that is jetted from jet device 62. The height of molten solder jetted is set so that molten solder reaches through holes 14 in circuit board 12 into which leads are inserted. The height of jetted molten solder can be controlled by the pumping amount of a pump.

Then, CPU 82a solders the current lead component (Step S180). That is, CPU 82a performs a series of operations heating the flux based on the soldering parameter obtained in Step S170, applying the solder to the leads of the lead component and peripheries thereof, and withdrawing the solder thereafter. As this occurs, CPU 82a waits for the solder to cure as required. While soldering, suction nozzle 38 holds the lead component so that the lead component is not raised from circuit board 12. While soldering, nitrogen gas continues to be injected from gas injection section 70 without any interruption. This is because oxidation of the solder and flux is prevented by the nitrogen gas.

Subsequently, CPU 82a determines whether all the mounting target components have been mounted on and soldered to circuit board 12 (Step S190), and when determining that the mounting and soldering of all the mounting target components has not yet been completed, CPU 82a returns to Step S120, where CPU 82a mounts and solders the next lead component. On the other hand, when it is determined that the mounting and soldering of all the mounting target components that are to be mounted on circuit board 12 has been completed, CPU 82a releases the fixing of circuit board 12 by clamping device 30 and controls board conveyance and holding device 26 so that circuit board 12 is conveyed out from the working position in component mounter 10 to an external portion thereof (Step S200), thereby ending this process routine.

Here, correspondence between the constituent elements of the embodiment and constituent elements of the present disclosure will be described. The soldering device 60 of this embodiment corresponds to a soldering device of the present disclosure, jet device 62 to a soldering means, HDD 82c to a memory means, and CPU 82a to a control means. In addition, gas injection section 70 corresponds to a gas injection section, suction nozzle 38 to a component support section, and jet device moving device 72 to a moving means. Further, component mounting device 32 corresponds to a component mounting device.

According to component mounter 10 of the embodiment that has been described heretofore, leads of a lead component are soldered with a value of a soldering parameter corresponding to the lead component type. Therefore, leads of each lead component of circuit board 12 on which a number of lead components are mounted can be soldered as required. In particular, since the soldering parameters listed in the table in FIG. 12 often have different values depending on the type of lead component, applying the soldering device of the present disclosure is highly meaningful.

Normally, flux is preheated before the flux is conveyed into component mounter 10; however, the flux is deprived of heat by the lead component that is mounted within component mounter 10, thereby reducing the temperature of the flux and causing the flux to deactivate from time to time. The larger the lead component, the more heat the flux tends to be deprived of. Therefore, it is preferable to appropriately reheat and activate the flux of the lead component by setting a flux heating time corresponding to the lead component type. Here, the flux is heated and activated by injecting nitrogen gas heated by the heat of molten solder toward the flux. Therefore, not only can the oxidation of the flux be prevented by the nitrogen gas, but also the heat of the molten solder can be effectively used to heat the flux.

Furthermore, since the solder withdrawal speed is set according to the type of lead component, for example, jet device 62 can be withdrawn away from below the lead component at low speeds or high speeds, or can be withdrawn away at low speeds initially and then withdrawn away at high speeds.

Furthermore, for a lead component like third lead component P3 that needs to be cured while being supported in a raised state after solder is applied, the lead component is supported in a raised state by use of suction nozzle 38 of component mounting device 32. As a result, the lead component can be reliably supported during the solder curing waiting time. In addition, since no other component support section than suction nozzle 38 needs to be provided, the cost can be reduced and the size can also be made compact.

Then, since soldering device 60 is integrated with component mounting device 32, compared with a case where both devices are provided separately, it is possible for a component to be shared, such as when suction nozzle 38 of component mounting device 32 is used as a component support section of soldering device 60. Therefore, not only a reduction in cost but also a reduction in size can be achieved. Additionally, since circuit board 12 does not have to be conveyed in and out of soldering device 60 and component mounting device 32 separately, a reduction in working time can be achieved.

The present disclosure is not limited to the embodiment described above, and the present disclosure can be carried out in various forms without departing from the sprit and technical scope of the present disclosure.

For example, in the embodiment described above, while component mounting device 32 is described as including two work heads 34, 36, only one work head may be provided, or three or more work heads may be provided.

In the embodiment described above, while suction nozzle 38 is described as picking up and holding electronic component by negative pressure, a configuration may be adopted in which an openable and closable arm is utilized in place of suction nozzle 38 so that electronic component is gripped or released by closing or opening the arm.

In the embodiment described above, while component mounter 10 is described as having soldering device 60 and component mounting device 32 integrated with each other, soldering device 60 may be configured as a single separate body.

In the embodiment described above, while nitrogen gas is described as being injected from gas injection section 70 at all times, nitrogen gas may be injected intermittently from gas injection section 70. For example, control device 82 may control gas injection section 70 so that nitrogen gas is injected during the flux heating time to heat flux F, or control device 82 may control gas injection section 70 so that nitrogen gas is not injected outside of the flux heating time. Although nitrogen gas may be applied to the periphery of flux F of circuit board 12 as shown in FIG. 13, nitrogen gas may be applied directly to flux F.

INDUSTRIAL APPLICABILITY

The present disclosure can be applied to the electronic component industry, and more particularly to an electronic component assembler such as a chip mounter.

DESCRIPTION OF REFERENCE SIGNS 10 component mounter, 12 circuit board, 14 through hole, 20 mounting machine main body, 22 frame section, 24 beam section, 26 board conveyance and holding device, 28 conveyance device, 30 clamping device, 32 component mounting device, 34, 36 work head, 38 suction nozzle, 40 work head moving device, 42 X-axis moving device, 44 Y-axis moving device, 46 Z-axis moving device 48, 50 slider, 48a, 50a slider rail, 52 mark camera, 54 parts camera, 56 component supply device, 58 tray-type component supply device, 59 bulk component supply device, 60 soldering device, 62 jet device, 64 solder bath, 66 jet nozzle, 67 partition pipe, 68 nozzle cover, 69 return passage, 70 gas injection section, 72 jet device moving device, 74 slider, 76 X-axis moving device, 78 Y-axis moving device, 80 Z-axis moving device, 82 control device, 82*a* CPU, 82*b* ROM, 82*c* HDD, 82*d* RAM, 82*e* input device, 82*f* display device, F flux, P1 to P4 first to fourth lead components, P1*a* to P4*a* component main body, P1*b* to P4*b* lead.

The invention claimed is:

1. A soldering device comprising:
a soldering device to solder leads of multiple lead component types mounted on a board by jetting molten solder reserved in a solder bath;
a memory to store correspondences between the lead component types and a value of a soldering parameter; and
a moving device to move the soldering device;
a control device configured to identify the lead component type to be soldered when sequentially soldering the multiple types of lead components by the soldering device, read out a value of the soldering parameter corresponding to the lead component type identified from the correspondences stored in the memory, and to control the soldering device so that the lead of the lead component is soldered based on the value of the soldering parameter read out, wherein
the soldering parameter includes a solder withdrawal speed, and
the control device controls the moving device so that the soldering device is moved downwards below the lead component after the soldering device ends its soldering operation at the solder withdrawal speed.

2. The soldering device of claim 1, wherein the soldering parameter also includes at least one of:
a flux heating time during which flux adhering to the board is heated before the molten solder is applied to the lead of the lead component;
a solder application time during which the molten solder is applied to the lead of the lead component;
a solder curing waiting time during which solder is allowed to cure while the lead component is supported to be raised from the board;
a tracing soldering speed at which the soldering device is moved in the direction in which leads are aligned in a case where the lead component includes a number of leads;
a height of the soldering device relative to the lead of the lead component, and a jetting height of the molten solder.

3. The soldering device according to claim 2, wherein the soldering parameter includes the flux heating time, the soldering device has a gas injecting section configured to inject nitrogen gas heated by heat of the molten solder, and
the control device controls the gas injecting section so that the nitrogen gas injected from the gas injecting section heats the flux during the flux heating time included in the value of the soldering parameter read out.

4. The soldering device according to claim 1, wherein the soldering parameter includes the solder curing waiting time, the soldering device having a component support section configured to support the lead component to be raised away from the board, and the control device controls the component support section so that the component support section supports the lead component with being raised away from the board for the duration of the solder curing waiting time included in the value of the soldering parameter read out.

5. The soldering device according to claim 1 wherein the soldering device being integrated with a component mounting device configured to hold the lead component supplied from a component supply device and move the lead component to a predetermined position on the board so that the lead of the lead component is inserted into a through hole provided in the predetermined position.

* * * * *